(12) United States Patent
Choi et al.

(10) Patent No.: US 9,786,728 B2
(45) Date of Patent: Oct. 10, 2017

(54) ORGANIC LIGHT EMITTING DISPLAY DEVICE

(71) Applicant: LG Display Co., Ltd., Seoul (KR)

(72) Inventors: Kimin Choi, Daejeon (KR); Yoonju Lee, Gangneung-Si (KR); Hongsuk Kim, Busan (KR); Kwanghun Jeon, Yeosu-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/272,109

(22) Filed: Sep. 21, 2016

(65) Prior Publication Data

US 2017/0012097 A1    Jan. 12, 2017

Related U.S. Application Data

(63) Continuation of application No. 14/815,159, filed on Jul. 31, 2015, now Pat. No. 9,455,309.

(30) Foreign Application Priority Data

Aug. 1, 2014  (KR) ........................ 10-2014-0098983

(51) Int. Cl.
*H01L 27/14* (2006.01)
*H01L 27/32* (2006.01)
*H01L 51/52* (2006.01)
*H01L 27/02* (2006.01)

(52) U.S. Cl.
CPC ...... *H01L 27/3272* (2013.01); *H01L 27/0248* (2013.01); *H01L 27/3223* (2013.01); *H01L 27/3262* (2013.01); *H01L 27/3276* (2013.01); *H01L 51/5221* (2013.01)

(58) Field of Classification Search
None
See application file for complete search history.

(56) References Cited

U.S. PATENT DOCUMENTS

| | | |
|---|---|---|
| 2001/0019384 A1 | 9/2001 | Murade |
| 2005/0082540 A1 | 4/2005 | Nishikawa |
| 2006/0250592 A1 | 11/2006 | Noguchi et al. |
| 2007/0210303 A1 | 9/2007 | Ikeda et al. |
| 2007/0296333 A1 | 12/2007 | Kim et al. |
| 2010/0176381 A1* | 7/2010 | Yagi ............... G02F 1/1368 257/40 |
| 2014/0167009 A1 | 6/2014 | Lee et al. |

FOREIGN PATENT DOCUMENTS

EP    0 862 077 A2    9/1998

* cited by examiner

*Primary Examiner* — Cory Eskridge
(74) *Attorney, Agent, or Firm* — Birch, Stewart, Kolasch & Birch, LLP

(57) ABSTRACT

Discussed is an organic light emitting display device that may include a first pixel on a substrate; a switching transistor with a first active layer provided inside the first pixel; a driving transistor with a second active layer provided inside the first pixel; a first light shielding layer overlapping the second active layer; and a second light shielding layer overlapping the first active layer, wherein the first light shielding layer is connected with the driving transistor, and the second light shielding layer is electrically insulated from the first light shielding layer.

19 Claims, 10 Drawing Sheets

ORGANIC LIGHT EMITTING DISPLAY DEVICE

CROSS REFERENCE TO RELATED APPLICATIONS

This application is a Continuation of co-pending U.S. application Ser. No. 14/815,159 filed on Jul. 31, 2015, which claims the benefit of the Korean Patent Application No. 10-2014-0098983 filed on Aug. 1, 2014, which is hereby incorporated by reference as if fully set forth herein.

BACKGROUND OF THE INVENTION

Field of the Disclosure

Embodiments of the present invention relate to an organic light emitting display device, and more particularly, to an organic light emitting display device with a thin film transistor of a top gate structure.

Discussion of the Related Art

An organic light emitting display device, which emits light in itself, is provided in such a structure in which a light emitting layer is formed between a cathode for injecting electron and an anode for injecting hole. When the electron generated in the cathode and the hole generated in the anode are injected into the inside of the light emitting layer, an exciton is produced by the electron and hole bond. Then, when the exciton falls to a ground state from an excited state, the organic light emitting display device emits light.

The organic light emitting display device includes a thin film transistor which functions as a switching device. The thin film transistor may be classified into a bottom gate structure and a top gate structure. In case of the bottom gate structure, a gate electrode is disposed below an active layer. Meanwhile, in case of the top gate structure, a gate electrode is disposed above an active layer.

Hereinafter, a related art organic light emitting display device with a thin film transistor of a top gate structure will be described with reference to the accompanying drawings.

FIG. 1 is a cross sectional view illustrating a related art organic light emitting display device.

As shown in FIG. 1, the related art organic light emitting display device may include a substrate 10, an active layer 20, a gate insulating film 25, a gate electrode 30, an insulating interlayer 35, a source electrode 40a, a drain electrode 40b, a passivation film 45, a planarization film 50, an anode 60, a bank layer 70, an organic emitting layer 80, and a cathode 90.

The active layer 20 functions as an electron transfer channel, and the active layer 20 is formed on the substrate 10. The gate insulating film 25 insulates the active layer 20 and the gate electrode 30 from each other, and the gate insulating film 25 is formed on the active layer 20. The gate electrode 30 is formed on the gate insulating film 25.

The insulating interlayer 35 is formed on the gate electrode 30. The insulating interlayer 35 is formed on the surface of the substrate 10, wherein the insulating interlayer 35 has a first contact hole for exposing one end of the active layer 20 and a second contact hole for exposing the other end of the active layer 20.

The source electrode 40a and the drain electrode 40b are formed on the insulating interlayer 35. The source electrode 40a is connected with the one end of the active layer 20 through the first contact hole, and the drain electrode 40b is connected with the other end of the active layer 20 through the second contact hole.

The passivation film 45 is formed on the source electrode 40a and the drain electrode 40b, wherein the passivation film 45 protects a thin film transistor provided therebelow. The planarization film 50 is formed on the passivation film 45, to planarize the surface of the substrate 10. The passivation film 45 and the planarization film 50 have a contact hole to expose the source electrode 40a therethrough.

The anode 60 is formed on the planarization film 50. The anode is connected with the source electrode 40a through the contact hole provided in the passivation film 45 and the planarization film 50. The bank layer 70 is formed on the planarization film 50. The bank layer 70, which is formed in a matrix configuration, defines a display area for displaying an image.

The organic emitting layer 80 is formed on the anode 60. The organic emitting layer 80 is formed in the display area defined by the bank layer 70. The cathode 90 is formed on the organic emitting layer 80.

In case of the related art organic light emitting display device, the active layer 20 is formed right on the upper surface of the substrate 10. Accordingly, the active layer 20 is exposed to external light being incident through the lower surface of the substrate 10, to thereby deteriorate reliability of the active layer 20.

SUMMARY OF THE INVENTION

Accordingly, embodiments of the present invention are directed to an organic light emitting display device that substantially obviates one or more problems due to limitations and disadvantages of the related art.

An aspect of embodiments of the present invention is directed to provide an organic light emitting display device, in which reliability of an active layer is improved. Another aspect of embodiments of the present invention is directed to provide an organic light emitting display device which facilitates to prevent an active layer from being exposed to external light.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device that may include a first pixel on a substrate; a switching transistor with a first active layer provided inside the first pixel; a driving transistor with a second active layer provided inside the first pixel; a first light shielding layer overlapping the second active layer; and a second light shielding layer overlapping the first active layer, wherein the first light shielding layer is connected with the driving transistor, and the second light shielding layer is electrically insulated from the first light shielding layer.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
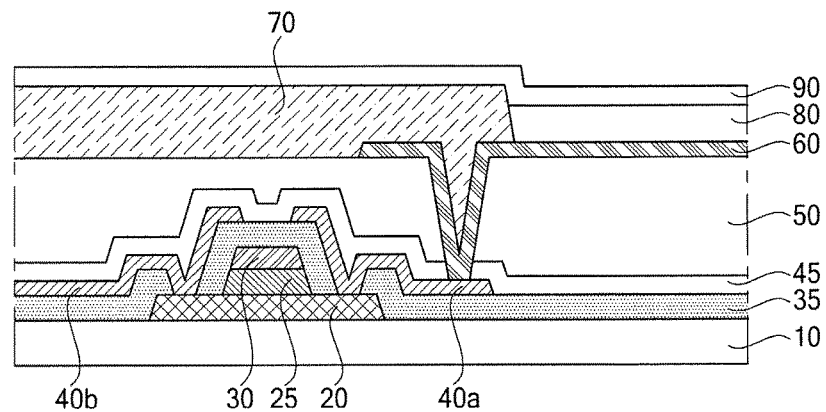
FIG. 1 is a cross sectional view illustrating a related art organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present invention will be described in detail with reference to the accompanying drawings.

Figure 2:
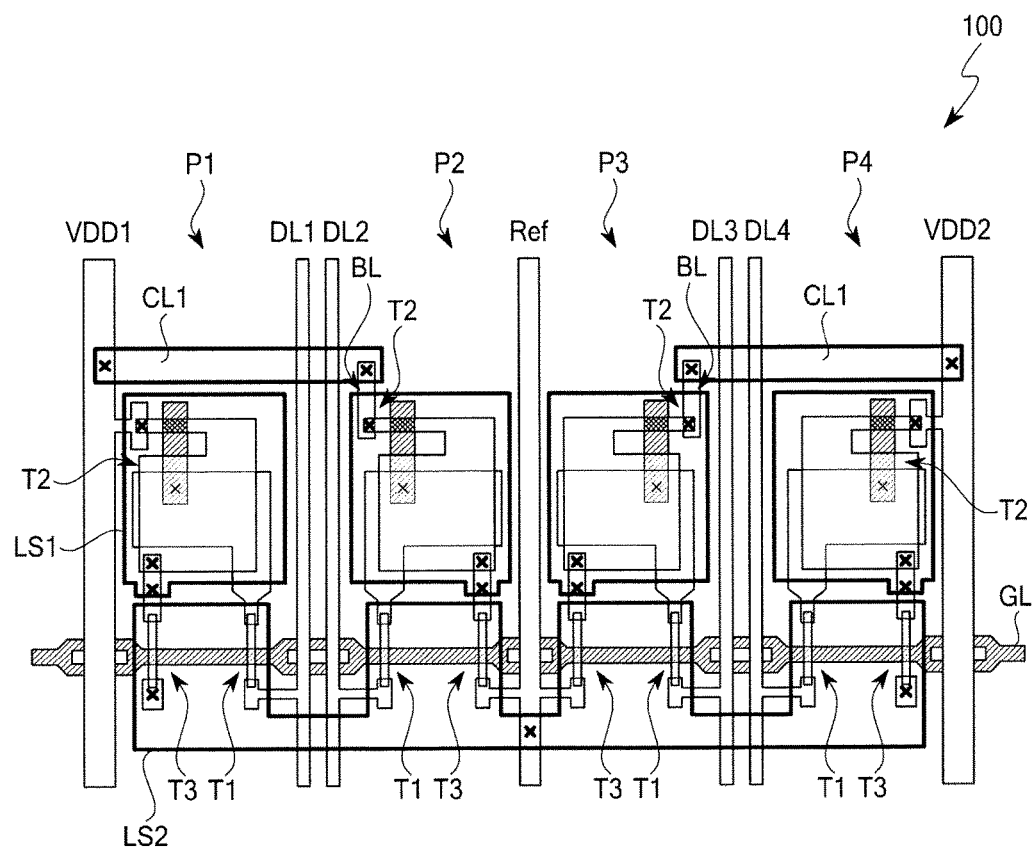
FIG. 2 is a plane view illustrating an organic light emitting display device according to one embodiment of the present invention.

FIG. 2 is a plane view illustrating an organic light emitting display device according to one embodiment of the present invention. FIG. 2 illustrates a unit pixel consisting of a first pixel (P1), a second pixel (P2), a third pixel (P3) and a fourth pixel (P4).

As shown in FIG. 2, the organic light emitting display device according to one embodiment of the present invention may include a substrate 100, a gate line (GL), first to fourth data lines (DL1, DL2, DL3, DL4), first and second power lines (VDD1, VDD2), a reference line (Ref), a switching thin film transistor (T1), a driving thin film transistor (T2), a sensing thin film transistor (T3), a first light shielding layer (LS1) and a second light shielding layer (LS2).

The first pixel (P1) is formed between the first power line (VDD1) and the first data line (DL1), the second pixel (P2) is formed between the second data line (DL2) and the reference line (Ref), the third pixel (P3) is formed between the reference line (Ref) and the third data line (DL3), and the fourth pixel (P4) is formed between the fourth data line (DL4) and the second power line (VDD2).

The switching thin film transistor (T1), the driving thin film transistor (T2) and the sensing thin film transistor (T3) are provided in each of the first pixel (P1), the second pixel (P2), the third pixel (P3) and the fourth pixel (P4), which are provided by a top gate structure in which a gate electrode is formed on an active layer.

The first pixel (P1), the second pixel (P2), the third pixel (P3) and the fourth pixel (P4) may be respectively formed of pixels for emitting red (R) light, white (W) light, blue (B) light and green (G) light, but not limited to this structure. Hereinafter, each element of the above structure will be described in detail as follows.

The substrate 100 may be formed of a transparent material. For example, the substrate 100 may be formed of glass or transparent plastic, but not limited to this material.

The gate line (GL) is formed in a first direction, for example, a horizontal direction on the substrate 100. The gate line (GL) is connected with the switching thin film transistor (T1) and the sensing thin film transistor (T3) provided in each of the first to fourth pixels (P1, P2, P3, P4).

A hole is formed in a predetermined area of the gate line (GL) being intersected with the data line (DL1, DL2, DL3, DL4), the power line (VDD1, VDD2) and the reference line (Ref). The hole enables to reduce an overlapping area between the gate line (GL) and the data line (DL1, DL2, DL3, DL4), an overlapping area between the gate line (GL) and the power line (VDD1, VDD2) and an overlapping area between the gate line (GL) and the reference line (Ref), to thereby reduce a signal interference.

The first data line (DL1), the second data line (DL2), the third data line (DL3) and the fourth data line (DL4) are formed in a second direction, for example, a longitudinal direction on the substrate 100. The second direction (e.g., longitudinal direction) may be perpendicular to the first direction (e.g., horizontal direction). The first data line (DL1) and the second data line (DL2) are disposed adjacent to each other so that another line is not formed between the first data line (DL1) and the second data line (DL2). The third data line (DL3) and the fourth data line (DL4) are disposed adjacent to each other so that another line is not formed between the third data line (DL3) and the fourth data line (DL4).

The first data line (DL1) is connected with a switching thin film transistor (T1) provided inside the first pixel (P1), the second data line (DL2) is connected with a switching thin film transistor (T1) provided inside the second pixel (P2), the third data line (DL3) is connected with a switching thin film transistor (T1) provided inside the third pixel (P3), and the fourth data line (DL4) is connected with a switching thin film transistor (T1) provided inside the fourth pixel (P4).

The first power line (VDD1) and the second power line (VDD2) are formed in the second direction, for example, the longitudinal direction on the substrate 100. Between the first power line (VDD1) and the second power line (VDD2), there are the first to fourth data lines (DL1, DL2, DL3, DL4) and the reference line (Ref). Although not shown, each data line of the neighboring unit pixel is disposed in the left side of the first power line (VDD1) and the right side of the second power line (VDD2).

The first power line (VDD1) is connected with a driving thin film transistor (T2) provided inside each of the first pixel (P1) and the second pixel (P2). The first power line (VDD1) is disposed adjacent to the first pixel (P1) so that it is easy to connect the first power line (VDD1) with the driving thin film transistor (T2) provided inside the first pixel (P1). However, the first power line (VDD1) is not disposed adjacent to the second pixel (P2) so that it is not easy to connect the first power line (VDD1) with the driving thin film transistor (T2) provided inside the second pixel (P2). Thus, the first power line (VDD1) is connected with the driving thin film transistor (T2) provided inside the second pixel (P2) through an additional first connection line (CL1) and a bridge line (BL). That is, the first connection line (CL1) is connected with the first power line (VDD1) and the bridge line (BL) through a contact hole (X), and the bridge line (BL) is connected with the first connection line (CL1) and the driving thin film transistor (T2) provided inside the second pixel (P2) through a contact hole (X). Herein, 'X' shown in the drawings indicates the contact hole for electrically connecting two elements overlapping each other with an insulating layer interposed therebetween, wherein the contact hole is formed in the insulating layer.

The second power line (VDD2) is connected with a driving thin film transistor (T2) provided inside each of the third pixel (P3) and the fourth pixel (P4). The second power line (VDD2) is disposed adjacent to the fourth pixel (P4) so that it is easy to connect the second power line (VDD2) with the driving thin film transistor (T2) provided inside the fourth pixel (P4). However, the second power line (VDD2) is not disposed adjacent to the third pixel (P3) so that it is not easy to connect the second power line (VDD2) with the driving thin film transistor (T2) provided inside the third pixel (P3). Thus, the second power line (VDD2) is connected with the driving thin film transistor (T2) provided inside the third pixel (P3) through an additional first connection line (CL1) and a bridge line (BL). That is, the first connection line (CL1) is connected with the second power line (VDD2) and the bridge line (BL) through a contact hole (X), and the bridge line (BL) is connected with the first connection line (CL1) and the driving thin film transistor (T2) provided inside the third pixel (P3) through a contact hole (X).

The reference line (Ref) is formed in the second direction, that is, the longitudinal direction on the substrate 100. The reference line (Ref) is disposed between the second data line (DL2) and the third data line (DL3).

The reference line (Ref) is connected with a sensing thin film transistor (T3) provided inside each of the first to fourth pixels (P1, P2, P3, P4). The reference line (Ref) is disposed adjacent to the second pixel (P2) and the third pixel (P3) so that it is easy to connect the reference line (Ref) with the sensing thin film transistor (T3) provided inside each of the second pixel (P2) and the third pixel (P3). However, the reference line (Ref) is not disposed adjacent to the first pixel (P1) and the fourth pixel (P4) so that it is not easy to connect the reference line (Ref) with the sensing thin film transistor (T3) provided inside each of the first pixel (P1) and the fourth pixel (P4). Thus, an additional structure for connection between the reference line (Ref) and the sensing thin film transistor (T3) provided inside each of the first pixel (P1) and the fourth pixel (P4) is required. According to one embodiment of the present invention, the second light shielding layer (LS2) is provided to connect the reference line (Ref) with the sensing thin film transistor (T3) provided inside the first pixel (P1) and to connect the reference line (Ref) with the sensing thin film transistor (T3) provided inside the fourth pixel (P4). That is, the second light shielding layer (LS2) is connected with the reference line (Ref), the sensing thin film transistor (T3) provided inside the first pixel (P1), and the sensing thin film transistor (T3) provided inside the fourth pixel (P4) through the respective contact holes (X).

A detailed structure of the switching thin film transistor (T1), the driving thin film transistor (T2) and the sensing thin film transistor (T3) will be described with reference to FIGS. 3A and 3B.

The first light shielding layer (LS1) covers an area of the driving thin film transistor (T2) provided inside the first to fourth pixels (P1, P2, P3, P4) so that it is possible to prevent external light from being incident on the active layer (not shown) of the driving thin film transistor (T2). It is unnecessary to form the first light shielding layer (LS1) in accordance with the shown pattern. The first light shielding layer (LS1) may be formed in any pattern enabling to at least partially (e.g., fully) cover the active layer (not shown) of the driving thin film transistor (T2). For example, a substantial portion of the active layer may be covered by the first light shielding layer (LS1), e.g., at least 90%, at least 95%, at least 99%, or 100%.

Accordingly, referring to FIG. 2, the first light shielding layer (LS1) is overlapped with the active layer of the driving thin film transistor (T2) between the substrate 100 and the active layer of the driving thin film transistor (T2). In other words, the first light shielding layer (LS1) may be disposed between the substrate (100) and the active layer of the driving thin film transistor (T2) and cover at least partially (e.g., fully) the region where the active layer of the driving thin film transistor (T2) is formed. This will be identically applied to the following second light shielding layer (LS2). That is, the second light shielding layer (LS2) is overlapped with the active layer of the switching thin film transistor (T1) between the substrate 100 and the active layer of the switching thin film transistor (T1). In other words, the second light shielding layer (LS2) may be disposed between the substrate (100) and the active layer of the switching thin film transistor (T1) and cover at least partially (e.g., fully) the region where the active layer of the switching thin film transistor (T1) is formed.

The first light shielding layer (LS1) is formed of a conductive material. If the first light shielding layer (LS1) of the conductive material is formed in an island-shaped structure being electrically insulated, it may have bad influences on an operation of the driving thin film transistor (T2). Thus, since the first light shielding layer (LS1) is electrically connected with the driving thin film transistor (T2) through a contact hole (X), it is possible to prevent bad influences on an operation of the driving thin film transistor (T2).

The first light shielding layer (LS1) is separately patterned in each of the first pixel (P1), the second pixel (P2), the third pixel (P3) and the fourth pixel (P4). That is, the first light shielding layer (LS1) patterned in the first pixel (P1), the first light shielding layer (LS1) patterned in the second pixel (P2), the first light shielding layer (LS1) patterned in the third pixel (P3) and the first light shielding layer (LS1) patterned in the fourth pixel (P4) are electrically insulated from one another. This is because the first light shielding layer (LS1) is electrically connected with the driving thin film transistor (T2) for each of the first pixel (P1), the second pixel (P2), the third pixel (P3) and the fourth pixel (P4).

The second light shielding layer (LS2) covers an area of the switching thin film transistor (T1) and the sensing thin film transistor (T3) provided inside the first to fourth pixels (P1, P2, P3, P4) so that it is possible to prevent external light from being incident on the active layer (not shown) of the switching thin film transistor (T1) and the active layer (not shown) of the sensing thin film transistor (T3). It is unnecessary to form the second light shielding layer (LS2) in accordance with the shown pattern. The second light shielding layer (LS2) may be formed in any pattern enabling to cover the active layer (not shown) of the switching thin film transistor (T1) and the active layer (not shown) of the sensing thin film transistor (T3).

The second light shielding layer (LS2) is formed of a conductive material. If the second light shielding layer (LS2) of the conductive material is formed in an island-shaped structure being electrically insulated, it may have bad influences on an operation of the switching thin film transistor (T1) and the sensing thin film transistor (T3). Thus, since the second light shielding layer (LS2) is connected with the reference line (Ref) through a contact hole (X), it is possible to prevent bad influences on an operation of the switching thin film transistor (T1) and the sensing thin film transistor (T3).

Instead of being separately patterned in each of the first pixel (P1), the second pixel (P2), the third pixel (P3) and the fourth pixel (P4), the second light shielding layer (LS2) is patterned as one body in the first pixel (P1), the second pixel (P2), the third pixel (P3) and the fourth pixel (P4). This is because the second light shielding layer (LS2) is connected with the reference line (Ref).

In the drawings, the first light shielding layer (LS1) is provided at a predetermined interval from the second light shielding layer (LS2). However, it is possible to connect the first light shielding layer (LS1) and the second light shielding layer (LS2) with each other in consideration of only the protection for the active layer of the thin film transistor (T1, T2, T3). In this case, a light shielding layer for covering the area of the switching thin film transistor (T1), the driving thin film transistor (T2) and the sensing thin film transistor (T3) in each of the first to fourth pixels (P1 to P4) is formed as one body, and the light shielding layer may be connected with the driving thin film transistor (T2) for each of the pixels (P1, P2, P3, P4). This is for preventing an operation of the driving thin film transistor (T2) from being badly influenced by the light shielding layer.

However, when the light shielding layer is formed as one body in the respective pixels (P1, P2, P3, P4) and is connected with the driving thin film transistor (T2), electric charges may be charged in the light shielding layer during the operation of the driving thin film transistor (T2), and the switching thin film transistor (T1) may be badly influenced by the electric charges of the light shielding layer, whereby a problem of data mixing may be caused by the malfunction of the switching thin film transistor (T1).

Thus, in case of one embodiment of the present invention, the first light shielding layer (LS1) covering the area of the driving thin film transistor (T2) and being connected with the driving thin film transistor (T2) is provided at a predetermined interval from the second light shielding layer (LS2) covering the area of the switching thin film transistor (T1) and the area of the sensing thin film transistor (T3), whereby the second light shielding layer (LS2) is electrically insulated from the first light shielding layer (LS1). Accordingly, it is possible to prevent a malfunction of the switching thin film transistor (T1) when the driving thin film transistor (T2) is operated.

In order to prevent the operation of the switching thin film transistor (T1) and the operation of the sensing thin film transistor (T2) from being badly influenced by the second light shielding layer (LS2) when the second light shielding layer (LS2) is provided at a predetermined interval from the first light shielding layer (LS1), the second light shielding layer (LS2) is connected with the reference line (Ref).

It does not always need to connect the second light shielding layer (LS2) with the reference line (Ref). Selectively, the second light shielding layer (LS2) may be connected with a low-voltage or ground-voltage line. This will be described later with reference to following various examples.

Figure 3A:
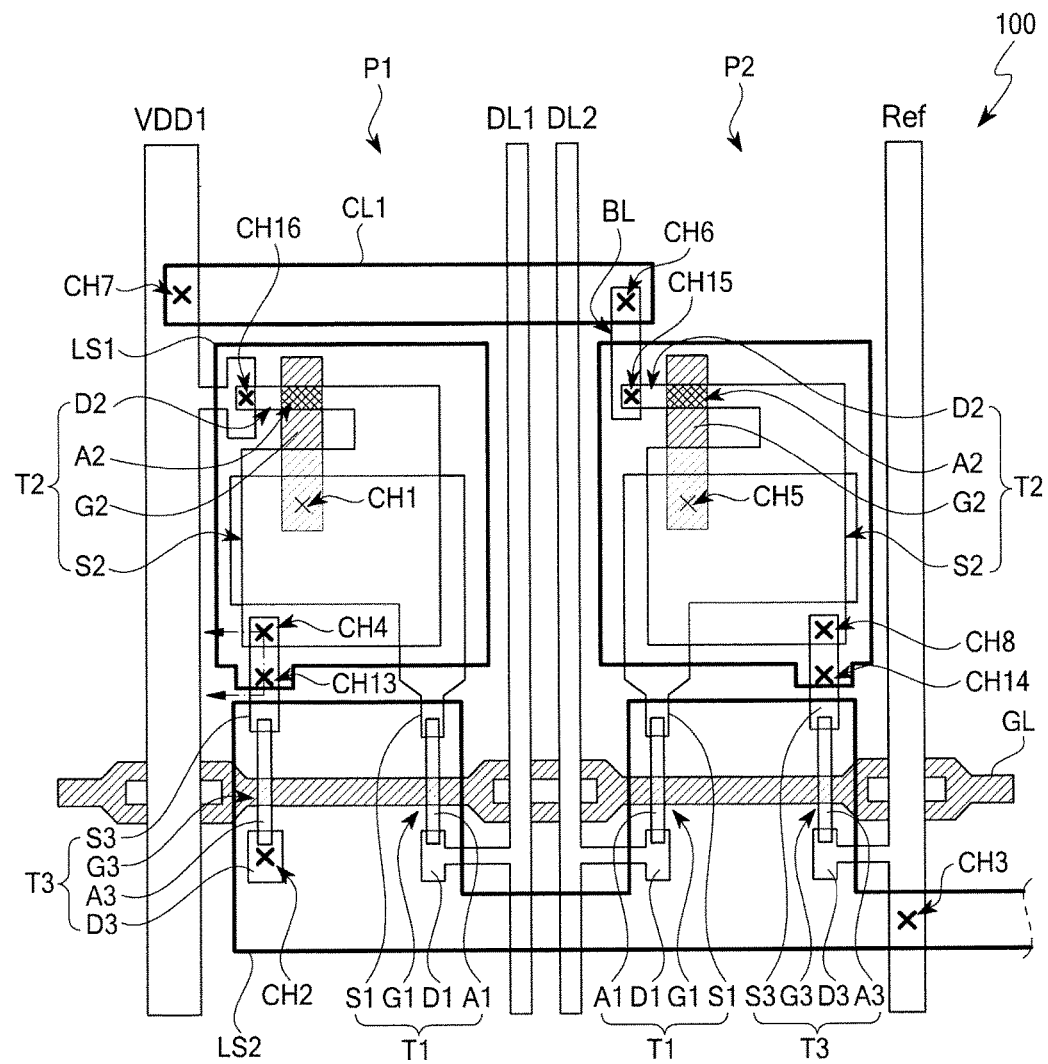
FIG. 3A is a detailed plane view illustrating first and second pixels of FIG. 2.
Figure 3B:
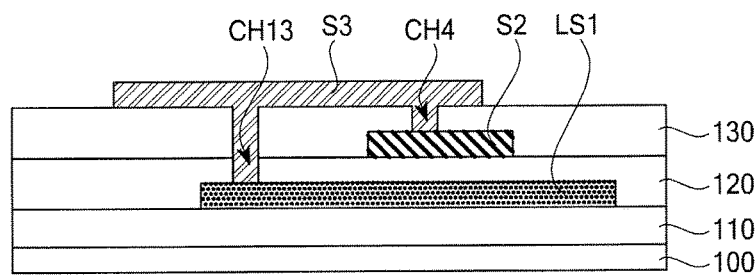
FIG. 3B is a cross sectional view illustrating an electrical connection between a first light shielding layer and a second source electrode of a driving thin film transistor shown in FIG. 3A.

FIG. 3A is a plane view illustrating the first pixel (P1) and the second pixel (P2) of FIG. 2, and FIG. 3B is a cross sectional view illustrating an electrical connection between a first light shielding layer and a second source electrode of a driving thin film transistor shown in FIG. 3A. In FIG. 2, the third and fourth pixels (P3, P4) are symmetric to the first and second pixels (P1, P2), whereby a detailed explanation for the third and fourth pixels (P3, P4) will be omitted.

As shown in FIG. 3A, the gate line (GL) is formed in the first direction, and the first power line (VDD1), the first and second data lines (DL1, DL2) and the reference line (Ref) are formed in the second direction being intersected with the gate line (GL). The first pixel (P1) is disposed between the first power line (VDD1) and the first data line (DL1), and the second pixel (P2) is disposed between the second data line (DL2) and the reference line (Ref).

In the first pixel (P1), there are the switching thin film transistor (T1), the driving thin film transistor (T2), the sensing thin film transistor (T3), the first light shielding layer (LS1) and the second light shielding layer (LS2).

The switching thin film transistor (T1) provided in the first pixel (P1) may include a first gate electrode (G1), a first source electrode (S1), a first drain electrode (D1) and a first active layer (A1).

The first gate electrode (G1) may be formed of a partial portion of the gate line (GL), but not limited to this structure. The first gate electrode (G1) may be diverged from the gate line (GL), or may be formed of an additional electrode connected with the gate line (GL) through a contact hole. The first drain electrode (D1) may be diverged from the first data line (DL1). The first source electrode (S1) faces with the first drain electrode (D1). In other words, the first source electrode (S1) is disposed opposite to the first drain electrode (D1). The first source electrode (S1) is connected with a second gate electrode (G2) of the driving thin film transistor (T2) through a first contact hole (CH1), and the first source electrode (S1) occupies a relatively large area so that it is possible to improve a capacitance (C). The first active layer (A1) is connected with the first source electrode (S1) and the first drain electrode (D1), whereby the first active layer (A1) functions as an electron transfer channel.

The driving thin film transistor (T2) provided in the first pixel (P1) may include the second gate electrode (G2), a second source electrode (S2), a second drain electrode (D2) and a second active layer (A2).

The second gate electrode (G2) is connected with the first source electrode (S1) of the switching thin film transistor (T1) through the first contact hole (CH1). The second drain electrode (D2) may be connected with a protrusion diverged from the first power line (VDD1) through a sixteenth contact hole (CH16). The second source electrode (S2) faces with the second drain electrode (D2). The second source electrode (S2) may be connected with a third source electrode (S3) of the sensing thin film transistor (T3) to be explained later through a fourth contact hole (CH4). Although not shown, the second source electrode (S2) is connected with an anode of an organic light emitting diode (OLED). The second active layer (A2) is connected with the second source electrode (S2) and the second drain electrode (D2), whereby the second active layer (A2) functions as an electron transfer channel. The second active layer (A2) may be formed of an oxide semiconductor material, and the second source electrode (S2) and the second drain electrode (D2) may be conductive by an annealing process of the oxide semiconductor material. In this case, the second active layer (A2), the second source electrode (S2) and the second drain electrode (D2) may be formed in the same layer. In particular, in the case that the second active layer (A2), the second source electrode (S2) and the second drain electrode (D2) are formed in the same layer, the second source electrode (S2) may be extended at one end of the second active layer (A2) and the second drain electrode (D2) may be extended at the other end of the second active layer (A2).

The sensing thin film transistor (T3) provided in the first pixel (P1) may include a third gate electrode (G3), the third source electrode (S3), a third drain electrode (D3) and a third active layer (A3).

The third gate electrode (G3) may be formed of a partial portion of the gate line (GL), but not limited to this structure. The third gate electrode (G3) may be diverged from the gate line (GL), or may be formed of an additional electrode connected with the gate line (GL) through a contact hole. The third source electrode (S3) may be connected with the second source electrode (S2) of the driving thin film transistor (T2) through the fourth contact hole (CH4), as mentioned above. The third drain electrode (D3) faces with the third source electrode (S3), and the third drain electrode (D3) is connected with the second light shielding layer (LS2) through a second contact hole (CH2).

The third active layer (A3) is connected with the third source electrode (S3) and the third drain electrode (D3), whereby the third active layer (A3) functions as an electron transfer channel.

In order to cover the second active layer (A2) of the driving thin film transistor (T2) by the first light shielding layer (LS1), an area of the first light shielding layer (LS1) provided in the first pixel (P1) is equal to or larger than an area of the second active layer (A2). The first light shielding layer (LS1) is connected with the second source electrode (S2) of the driving thin film transistor (T2) through a fourth contact hole (CH4) and a thirteenth contact hole (CH13).

Referring to FIG. 3B, a first insulating layer 110, a first light shielding layer (LS1), a second insulating layer 120, a second source electrode (S2), a third insulating layer 130, and a third source electrode (S3) are sequentially formed on a substrate 100. The first light shielding layer (LS1) is connected with the third source electrode (S3) through a thirteenth contact hole (CH13), and the third source electrode (S3) is connected with the second source electrode (S2) through a fourth contact hole (CH4). Accordingly, the first light shielding layer (LS1) is connected with the second source electrode (S2) via the third source electrode (S3).

The first light shielding layer (LS1) comprises a protrusion structure in the area of the thirteenth contact hole (CH13) to facilitate a process of forming the thirteenth contact hole (CH13).

In order to cover the first active layer (A1) of the switching thin film transistor (T1) and the third active layer (A3) of the sensing thin film transistor (T3) by the second light shielding layer (LS2), an area of the second light shielding layer (LS2) provided in the first pixel (P1) is equal to or larger than an area of the first active layer (A1) and third active layer (A3). The second light shielding layer (LS2) is connected with the third drain electrode (D3) of the sensing thin film transistor (T3) through the second contact hole (CH2), and is also connected with the reference line (Ref) through the third contact hole (CH3).

The switching thin film transistor (T1), the driving thin film transistor (T2), the sensing thin film transistor (T3), the first light shielding layer (LS1) and the second light shielding layer (LS2) are formed in the second pixel (P2). Hereinafter, a repetitive explanation for the same structure as the aforementioned first pixel (P1) will be omitted.

The switching thin film transistor (T1) provided in the second pixel (P2) may include a first gate electrode (G1), a first source electrode (S1), a first drain electrode (D1) and a first active layer (A1).

The first gate electrode (G1) may be formed of a partial portion of the gate line (GL), the first drain electrode (D1) may be diverged from the second data line (DL2), the first source electrode (S1) may be connected with a second gate electrode (G2) of the driving thin film transistor (T2) through a fifth contact hole (CH5), and the first active layer (A1) may be connected with the first source electrode (S1) and the first drain electrode (D1).

The driving thin film transistor (T2) provided in the second pixel (P2) may include the second gate electrode (G2), a second source electrode (S2), a second drain electrode (D2) and a second active layer (A2).

The second gate electrode (G2) may be connected with the first source electrode (S1) of the switching thin film transistor (T1) through the fifth contact hole (CH5), as described above. The second drain electrode (D2) may be connected with the first power line (VDD1) through a first connection line (CL1) and a bridge line (BL). The first connection line (CL1) is connected with the bridge line (BL) through a sixth contact hole (CH6), and is connected with the first power line (VDD1) through a seventh contact hole (CH7). The bridge line (BL) is connected with the second drain electrode (D2) through a fifteenth contact hole (CH15). The second source electrode (S2) may be connected with a third source electrode (S3) of the sensing thin film transistor (T3) to be explained later through an eighth contact hole (CH8). The second active layer (A2) is connected with the second source electrode (S2) and the second drain electrode (D2).

The sensing thin film transistor (T3) provided in the second pixel (P2) may include a third gate electrode (G3), the third source electrode (S3), a third drain electrode (D3) and a third active layer (A3).

The third gate electrode (G3) may be formed of a partial portion of the gate line (GL), the third source electrode (S3) may be connected with the second source electrode (S2) of the driving thin film transistor (T2) through the eighth contact hole (CH8), the third drain electrode (D3) may be diverged from the reference line (Ref), and the third active layer (A3) may be connected with the third source electrode (S3) and the third drain electrode (D3).

In order to cover the second active layer (A2) of the driving thin film transistor (T2) by the first light shielding layer (LS1), an area of the first light shielding layer (LS1) provided in the second pixel (P2) is equal to or larger than an area of the second active layer (A2). Also, the first light shielding layer (LS1) provided in the second pixel (P2) is connected with the second source electrode (S2) of the driving thin film transistor (T2) through the eighth contact hole (CH8) and a fourteenth contact hole (CH14).

The first light shielding layer (LS1) is connected with the third source electrode (S3) through the fourteenth contact hole (CH14), and the third source electrode (S3) is connected with the second source electrode (S2) through the eighth contact hole (CH8). Accordingly, the first light shielding layer (LS1) is connected with the second source electrode (S2) via the third source electrode (S3). The first light shielding layer (LS1) comprises a protrusion structure in the area of the fourth contact hole (CH14) to facilitate a process of forming the fourteenth contact hole (CH14).

In order to cover the first active layer (A1) of the switching thin film transistor (T1) and the third active layer (A3) of the sensing thin film transistor (T3) by the second light shielding layer (LS2), an area of the second light shielding layer (LS2) provided in the second pixel (P2) is equal to or larger than an area of the first active layer (A1) and third active layer (A3). The second light shielding layer (LS2) provided in the second pixel (P2) is formed as one body with the second light shielding layer (LS2) provided in the first pixel (P1). The second light shielding layer (LS2) having the above structure, which is overlapped with the first data line (DL1) and the second data line (DL2), extends from the first pixel (P1) to the second pixel (P2).

The second light shielding layer (LS2) prevents external light from being incident on the first active layer (A1) and third active layer (A3) formed in each of the first pixel (P1) and the second pixel (P2), and also connects the third drain electrode (D3) included in the sensing thin film transistor (T3) of the first pixel (P1) which is not adjacent to the reference line (Ref) with the reference line (Ref).

Figure 4:
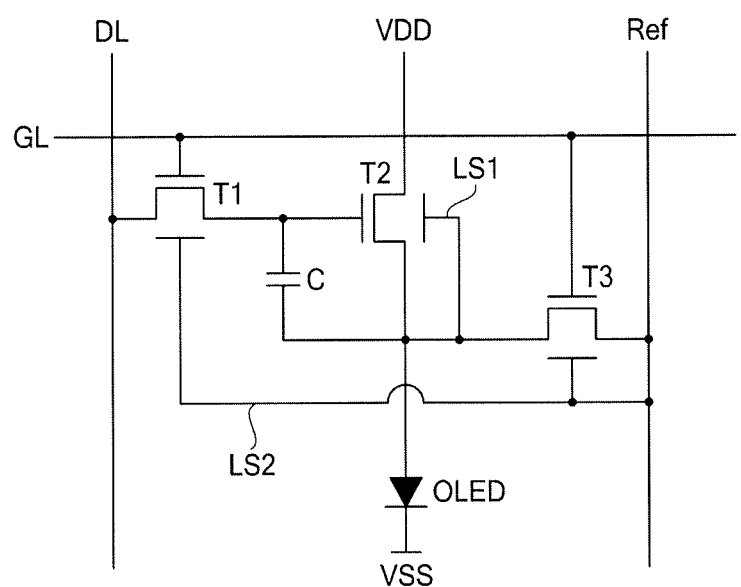
FIG. 4 is a circuit diagram illustrating an organic light emitting display device according to one embodiment of the present invention.

FIG. 4 is a circuit diagram of the organic light emitting display device according to one embodiment of the present invention, which corresponds to the circuit diagram for each of the pixels (P1, P2, P3, P4) included in the organic light emitting display device shown in FIG. 2.

As shown in FIG. 4, the organic light emitting display device according to one embodiment of the present invention may include the gate line (GL), the data line (DL), the power line (VDD), the reference line (Ref), the switching thin film transistor (T1), the driving thin film transistor (T2), the sensing thin film transistor (T3), a capacitor (C), the organic light emitting diode (OLED), the first light shielding layer (LS1) and the second light shielding layer (LS2).

According as the switching thin film transistor (T1) is switched by a gate signal supplied to the gate line (GL), the switching thin film transistor (T1) supplies a data voltage supplied from the data line (DL) to the driving thin film transistor (T2).

According as the driving thin film transistor (T2) is switched by the data voltage supplied from the switching thin film transistor (T1), the driving thin film transistor (T2) generates a data current from power supplied from the power line (VDD), and supplies the generated data current to the organic light emitting diode (OLED).

The sensing thin film transistor (T3) senses a threshold voltage deviation of the driving thin film transistor (T2), which causes deterioration of picture quality. This sensing of the threshold voltage deviation is carried out in a sensing mode. The sensing thin film transistor (T3) supplies a current of the driving thin film transistor (T2) to the reference line (Ref) in response to a sensing control signal supplied from the gate line (GL).

The capacitor (C) maintains the data voltage supplied to the driving thin film transistor (T2) for one frame, wherein the capacitor (C) is connected with gate and source terminals of the driving thin film transistor (T2).

The organic light emitting diode (OLED) emits a predetermined light in accordance with the data current supplied from the driving thin film transistor (T2). The organic light emitting diode (OLED) may include an anode connected with the source electrode (See 'S2' of FIG. 3) of the driving thin film transistor (T2), and an organic emitting layer and a cathode sequentially formed on the anode. The cathode of the organic light emitting diode (OLED) is connected with a low power line (VSS).

The first light shielding layer (LS1) covering the active layer of the driving thin film transistor (T2) is connected with the source terminal of the driving thin film transistor (T2).

The second light shielding layer (LS2) covering the active layer of the switching thin film transistor (T1) and the active layer of the sensing thin film transistor (T3) is connected with the reference line (Ref).

In the embodiments, the first light shielding layer (LS1) is connected with the source electrode (S2) of the driving thin film transistor (T2). The source electrode (S2) and the drain electrode (D2) can be switched based on the mode of the driving thin film transistor (T2). Accordingly, in the embodiments, the first shielding layer (LS1) may be connected with the drain electrode (D2) of the driving thin film transistor (T2).

Figure 5:
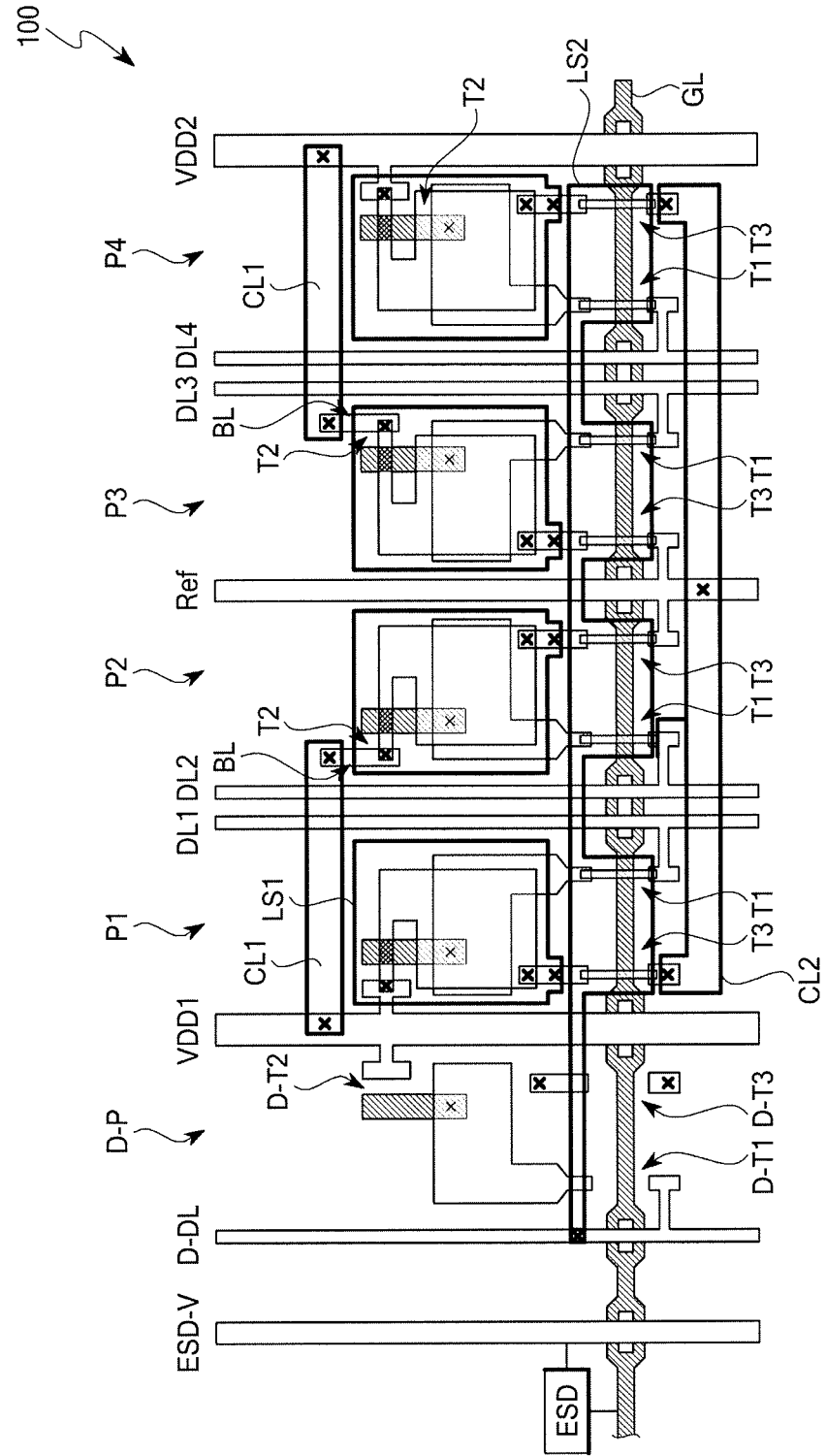
FIG. 5 is a plane view illustrating an organic light emitting display device according to another embodiment of the present invention.

FIG. 5 is a plane view illustrating an organic light emitting display device according to another embodiment of the present invention. In case of the organic light emitting display device of FIG. 5, a dummy pixel (D-P) and an electrostatic discharging circuit (ESD) are provided together with a unit pixel comprising a first pixel (P1), a second pixel (P2), a third pixel (P3) and a fourth pixel (P4).

In case of the organic light emitting display device of FIG. 5, a second light shielding layer (LS2) is connected with not a reference line (Ref) but a dummy data line (D-DL) of the dummy pixel (D-P).

As shown in FIG. 5, the organic light emitting display device according to another embodiment of the present invention may include a substrate 100, a gate line (GL), first to fourth data lines (DL1, DL2, DL3, DL4), first and second power lines (VDD1, VDD2), the reference line (Ref), a switching thin film transistor (T1), a driving thin film transistor (T2), a sensing thin film transistor (T3), the dummy data line (D-DL), a dummy switching thin film transistor (D-T1), a dummy driving thin film transistor (D-T2), a dummy sensing thin film transistor (D-T3), an electrostatic discharging line (ESD-V), an electrostatic discharging circuit (ESD), a first light shielding layer (LS1) and the second light shielding layer (LS2).

For the following description of the organic light emitting display device of FIG. 5, the same reference numbers will be used to refer to the same parts as those of the aforementioned embodiment of the present invention, and only different parts will be described in detail.

As shown in FIG. 5, according to another embodiment of the present invention, the dummy pixel (D-P) is formed adjacent to the first pixel (P1). The dummy pixel (D-P) is disposed between the dummy data line (D-DL) and the first power line (VDD1). The dummy pixel (D-P) may be an inoperable pixel. For example, the dummy pixel (D-P) may have been formed together with regular (operable) pixels (e.g., pixels P1, P2, P3 and P4) and may have a structure that is to some extent similar to the structure of a regular pixel (e.g., any one of pixels P1, P2, P3 or P4), but may be configured such that it is not capable of emitting light.

The dummy pixel (D-P) improves a pattern precision of the first pixel (P1) corresponding to the outermost pixel. This will be described in detail as follows. When a plurality of pixels are formed in a pixel region, the plurality of pixels are patterned through a plurality of mask processes. Generally, in case of the first pixel (P1) corresponding to the outermost pixel, it is very difficult to precisely control an exposure amount for the mask process, that is, it is very difficult to precisely pattern the first pixel (P1). In case of this embodiment of the present invention, since the dummy pixel (D-P) is formed adjacent to the first pixel (P1), the dummy pixel (D-P) is the outermost pixel, whereby it is possible to improve a pattern precision of the first pixel (P1).

Also, the dummy pixel (D-P) enables to minimize a damage of the pixel region caused by static electricity. If the dummy pixel (D-P) is formed in the outermost region, the dummy pixel (D-P) is damaged by an electrostatic problem so that it is possible to reduce damage on the pixels of the pixel region.

The dummy pixel (D-P) may include the dummy switching thin film transistor (D-T1), the dummy driving thin film transistor (D-T2) and the dummy sensing thin film transistor (D-T3). The dummy switching thin film transistor (D-T1), the dummy driving thin film transistor (D-T2) and the dummy sensing thin film transistor (D-T3) may be designed not to allow an operation since the dummy pixel (D-P) does not emit light. For example, the dummy switching thin film transistor (D-T1), the dummy driving thin film transistor (D-T2) and the dummy sensing thin film transistor (D-T3) may be designed not to include the active layer therein so as prevent the electron transfer.

The electrostatic discharging line (ESD-V) is arranged at the periphery (in other words, at the outer edge) of the dummy data line (D-DL). The electrostatic discharging circuit (ESD) is connected with the electrostatic discharging line (ESD-V) and the gate line (GL). Although not shown in detail, the electrostatic discharging circuit (ESD) may be formed of a thin film transistor. By combination of the electrostatic discharging line (ESD-V) and the electrostatic discharging circuit (ESD), it is possible to prevent the static electricity which might occur in the gate line (GL). That is, if the static electricity occurs in the gate line (GL), the static electricity is discharged through the electrostatic discharging line (ESD-V) via the electrostatic discharging circuit (ESD).

The first light shielding layer (LS1) is identical to that of the aforementioned embodiment, whereby a detailed explanation for the first light shielding layer (LS1) will be omitted.

The second light shielding layer (LS2) is somewhat different from that of the aforementioned embodiment. In the same manner as the aforementioned embodiment of the present invention, the second light shielding layer (LS2) covers the area of the switching thin film transistor (T1) and the area of the sensing thin film transistor (T3) in the first pixel (P1), the second pixel (P2), the third pixel (P3) and the fourth pixel (P4). However, in case of the organic light emitting display device of FIG. 5, the second light shielding layer (LS2) is connected with the dummy data line (D-DL) so as to prevent bad influences on the operation of the switching thin film transistor (T1) and the sensing thin film transistor (T3).

In the aforementioned embodiment of the present invention, the second light shielding layer (LS2) connects the sensing thin film transistor (T3) of the first pixel (P1) with the reference line (Ref), and also connects the sensing thin film transistor (T3) of the fourth pixel (P4) with the reference line (Ref). However, in case of the organic light emitting display device shown in FIG. 5, the second light shielding layer (LS2) is not connected with the reference line (Ref). That is, it is necessary to provide an additional structure for connecting the sensing thin film transistor (T3) of the first pixel (P1) with the reference line (Ref), and connecting the sensing thin film transistor (T3) of the fourth pixel (P4) with the reference line (Ref). Thus, in case of the organic light emitting display device shown in FIG. 5, a second connection line (CL2) is additionally provided. The second connection line (CL2) is connected with the sensing thin film transistor (T3) of the first pixel (P1), the reference line (Ref) and the sensing thin film transistor (T3) of the fourth pixel (P4) through a contact hole (X).

Figure 6:
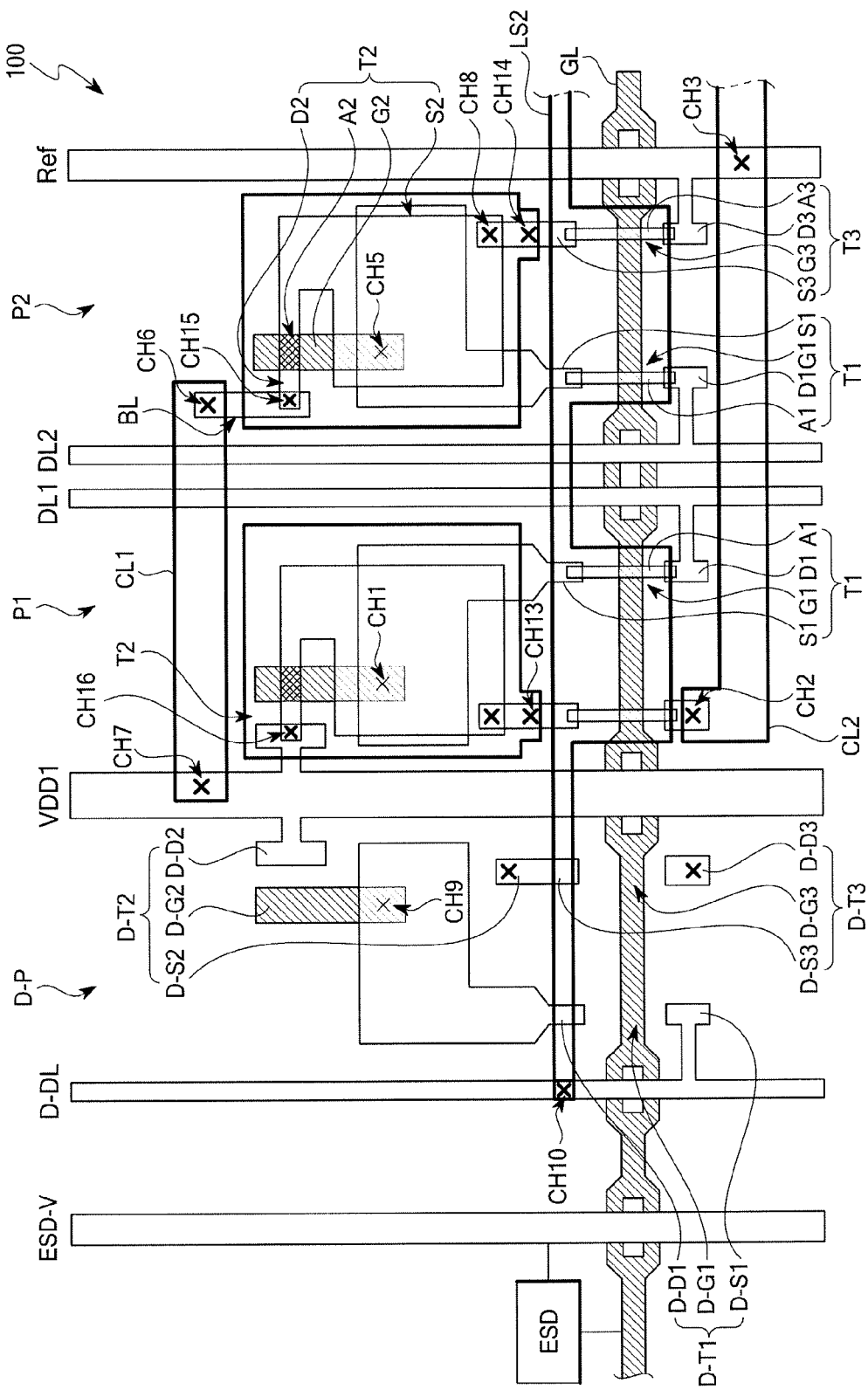
FIG. 6 is a detailed plane view illustrating first and second pixels, a dummy pixel and an electrostatic prevention circuit of FIG. 5.

FIG. 6 is a detailed plane view illustrating the first pixel (P1), the second pixel (P2), the dummy pixel (D-P) and the electrostatic discharging circuit (ESD) of FIG. 5. Hereinafter, only different parts will be described in detail.

As shown in FIG. 6, the dummy data line (D-DL) being intersected with the gate line (GL) is formed in the left side of the first power line (VDD1), whereby the dummy pixel (D-P) is formed between the first power line (VDD1) and the dummy data line (D-DL).

The dummy pixel (D-P) may include the dummy switching thin film transistor (D-T1), the dummy driving thin film transistor (D-T2) and the dummy sensing thin film transistor (D-T3).

The dummy switching thin film transistor (D-T1) may include a first dummy gate electrode (D-G1) formed of a partial portion of the gate line (GL), a first dummy source electrode (D-S1) diverged from the dummy data line (D-DL) and a first dummy drain electrode (D-D1) facing with the first dummy source electrode (D-S1). The dummy switching thin film transistor does not include the active layer therein so that a channel for electron transfer is not formed, and thus the dummy switching thin film transistor (D-T1) does not function as a switching thin film transistor.

The dummy driving thin film transistor (D-T2) may include a second dummy gate electrode (D-G2) connected with the first dummy drain electrode (D-D1) through a ninth contact hole (CH9), a second dummy drain electrode (D-D2) diverged from the first power line (VDD1) and a second dummy source electrode (D-S2) facing with the second dummy drain electrode (D-D2). The dummy driving thin film transistor (D-T2) does not include the active layer therein so that a channel for the electron transfer is not formed, and thus the dummy driving thin film transistor (D-T2) does not function as a driving thin film transistor.

The dummy sensing thin film transistor (D-T3) may include a third dummy gate electrode (D-G3) formed of a partial portion of the gate line (GL), a third dummy source electrode (D-S3) formed of the second dummy source electrode (D-S2) and a third dummy drain electrode (D-D3) facing with the third dummy source electrode (D-S3). The dummy sensing thin film transistor (D-T3) does not include the active layer therein so that a channel for the electron transfer is not formed, and thus the dummy sensing thin film transistor (D-T3) does not function as a sensing thin film transistor. Thus, it is unnecessary to connect the third dummy drain electrode (D-D3) with the reference line (Ref).

In the same manner as the aforementioned embodiment, the first light shielding layer (LS1) is patterned in each of the first pixel (P1) and the second pixel (P2). Also, the second light shielding layer (LS2) is formed as one body in the first pixel (P1) and the second pixel (P2). In order to cover the first active layer (A1) of the switching thin film transistor (T1) and the third active layer (A3) of the sensing thin film transistor (T3) formed in the first pixel (P1) and the second pixel (P2) by the second light shielding layer (LS2), an area of the second light shielding layer (LS2) is equal to or larger than an area of the first active layer (A1) and the third active layer (A3). The second light shielding layer (LS2), which is overlapped with the first data line (DL1), the second data line (DL3) and the first power line (VDD1), extends from the second pixel (P2) to the dummy data line (D-DL) of the dummy pixel (D-P) via the first pixel (P1).

Especially, the second light shielding layer (LS2) is connected with the dummy data line (D-DL) through a tenth contact hole (CH10). The dummy data line (D-DL) is not supplied with a data voltage for emission. Thus, it is possible to supply a predetermined voltage to the dummy data line (D-DL). If the second light shielding layer (LS2) is connected with the dummy data line (D-DL), it has an advantage of selecting an optimal voltage whose level has no bad influences on the operation of the switching thin film transistor (T1) and the sensing thin film transistor (T3) in the first pixel (P1) and the second pixel (P2), and supplying the selected optimal voltage to the dummy data line (D-DL).

As described above, the second connection line (CL2) is additionally formed to connect the sensing thin film transistor (T3) of the first pixel (P1) with the reference line (Ref). The second connection line (CL2) is connected with the third drain electrode (D3) of the sensing thin film transistor (T3) in the first pixel (P1) through the second contact hole (CH2), and is connected with the reference line (Ref) through the third contact hole (CH3).

Figure 7:
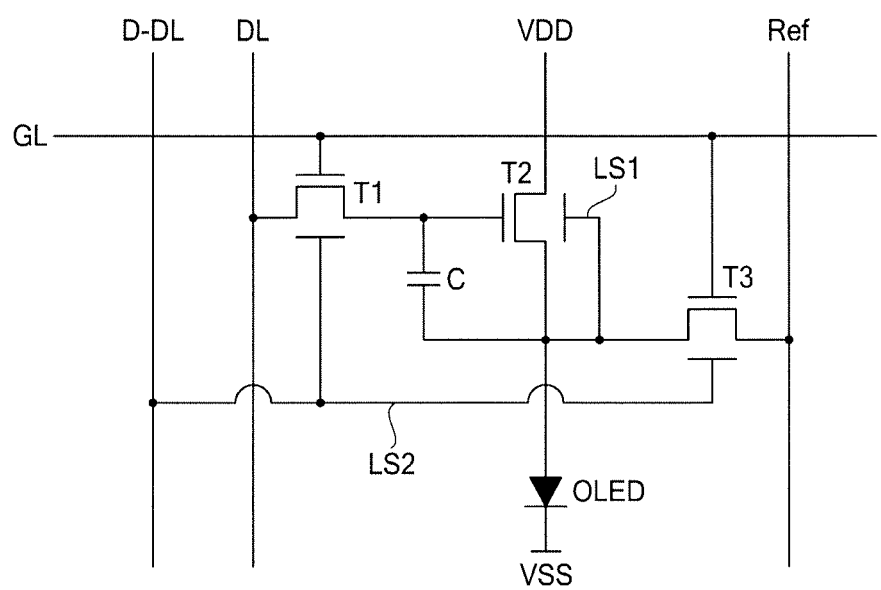
FIG. 7 is a circuit diagram illustrating an organic light emitting display device according to another embodiment of the present invention.

FIG. 7 is a circuit diagram illustrating the organic light emitting display device according to another embodiment of the present invention, which corresponds to a circuit diagram for each of the pixels (P1, P2, P3, P4) included in the organic light emitting display device shown in FIG. 5.

As shown in FIG. 7, the organic light emitting display device according to another embodiment of the present invention may include the gate line (GL), the dummy data line (D-DL), the data line (DL), the power line (VDD), the reference line (Ref), the switching thin film transistor (T1), the driving thin film transistor (T2), the sensing thin film transistor (T3), a capacitor (C), an organic light emitting diode (OLED), the first light shielding layer (LS1) and the second light shielding layer (LS2).

Except that the dummy data line (D-DL) is additionally provided and the second light shielding layer (LS2) is changed in its connection structure, the circuit diagram of FIG. 7 is the same as the circuit diagram of FIG. 4, whereby a detailed explanation for the same parts will be omitted.

As shown in FIG. 7, according to another embodiment of the present invention, the second light shielding layer (LS2) covering the active layer of the switching thin film transistor (T1) and the active layer of the sensing thin film transistor (T3) is connected with the dummy data line (D-DL).

Figure 8:
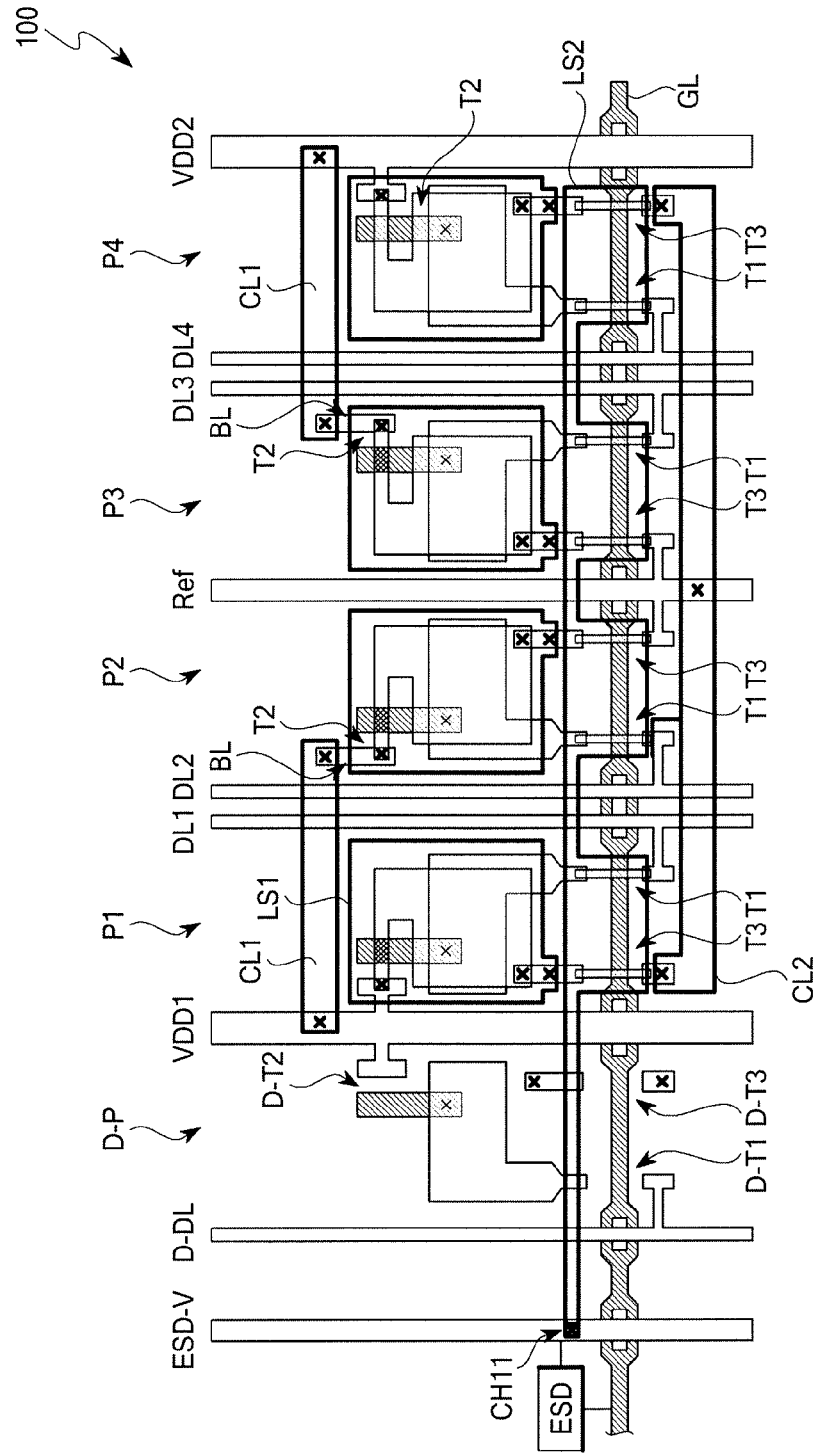
FIG. 8 is a plane view illustrating an organic light emitting display device according to another embodiment of the present invention.

FIG. 8 is a plane view illustrating an organic light emitting display device according to another embodiment of the present invention. Except that a second light shielding layer (LS2) is connected with an electrostatic discharging line (ESD-V) instead of a dummy data line (D-DL) of a dummy pixel (D-P), the organic light emitting display device of FIG. 8 is the same as the organic light emitting display device of FIG. 5, whereby only different parts will be described as follows.

As shown in FIG. 8, the second light shielding layer (LS2), which is overlapped with the dummy data line (D-DL), a first power line (VDD1), a first data line (DL1), a second data line (DL2), a reference line (Ref), a third data line (DL3) and a fourth data line (DL4), extends from a fourth pixel (P4) to the electrostatic discharging line (ESD-V) via the dummy pixel (D-P). Although not shown in detail, the second light shielding layer (LS2) may extend to be connected with all unit pixels arranged in the same row as that of unit pixel comprising the first to fourth pixels (P1, P2, P3, P4), which will be identically applied to the embodiment of FIG. 5.

Especially, the second light shielding layer (LS2) is connected with the electrostatic discharging line (ESD-V) through an eleventh contact hole (CH11).

Meanwhile, FIG. 8 shows that the dummy pixel (D-P) is included in the organic light emitting display device, but not necessarily. That is, it is possible to remove the dummy pixel (D-P) from the organic light emitting display device of FIG. 8, and to form the electrostatic discharging line (ESD-V) adjacent to the left side of the first power line (VDD1).

Figure 9:
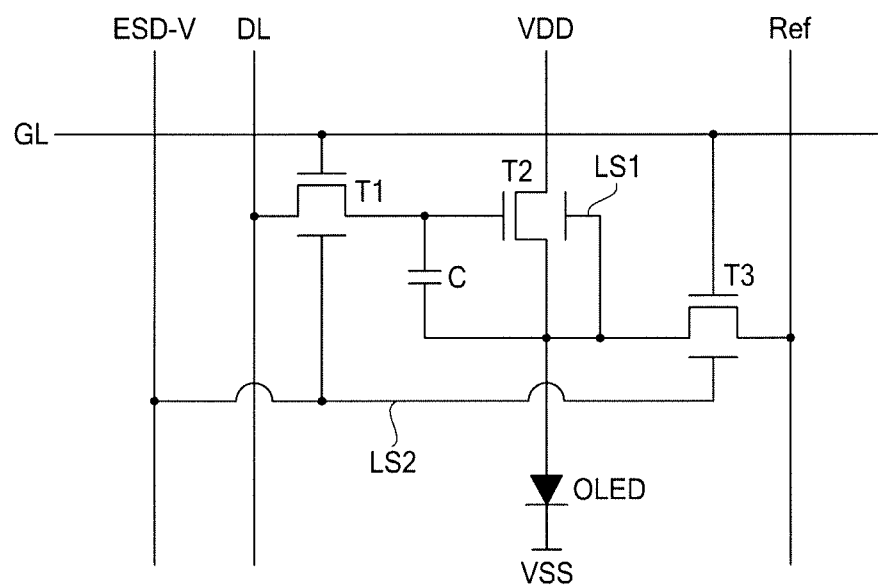
FIG. 9 is a circuit diagram illustrating an organic light emitting display device according to another embodiment of the present invention.

FIG. 9 is a circuit diagram illustrating an organic light emitting display device according to another embodiment of the present invention. The organic light emitting display device of FIG. 9 is obtained by removing the dummy pixel (D-P) from the organic light emitting display device of FIG. 8.

As shown in FIG. 9, the organic light emitting display device according to another embodiment of the present invention may include a gate line (GL), an electrostatic discharging line (ESD-V), a data line (DL), a power line (VDD), a reference line (Ref), a switching thin film transistor (T1), a driving thin film transistor (T2), a sensing thin film transistor (T3), a capacitor (C), an organic light emitting diode (OLED), a first light shielding layer (LS1) and a second light shielding layer (LS2).

Except that the electrostatic discharging line (ESD-V) is additionally provided and the second light shielding layer (LS2) is changed in its connection structure, the circuit diagram of FIG. 9 is the same as the circuit diagram of FIG. 4, whereby a detailed explanation for the same parts will be omitted.

As shown in FIG. 9, according to another embodiment of the present invention, the second light shielding layer (LS2) covering an active layer of the switching thin film transistor (T1) and an active layer of the sensing thin film transistor (T3) is connected with the electrostatic discharging line (ESD-V).

Figure 10:
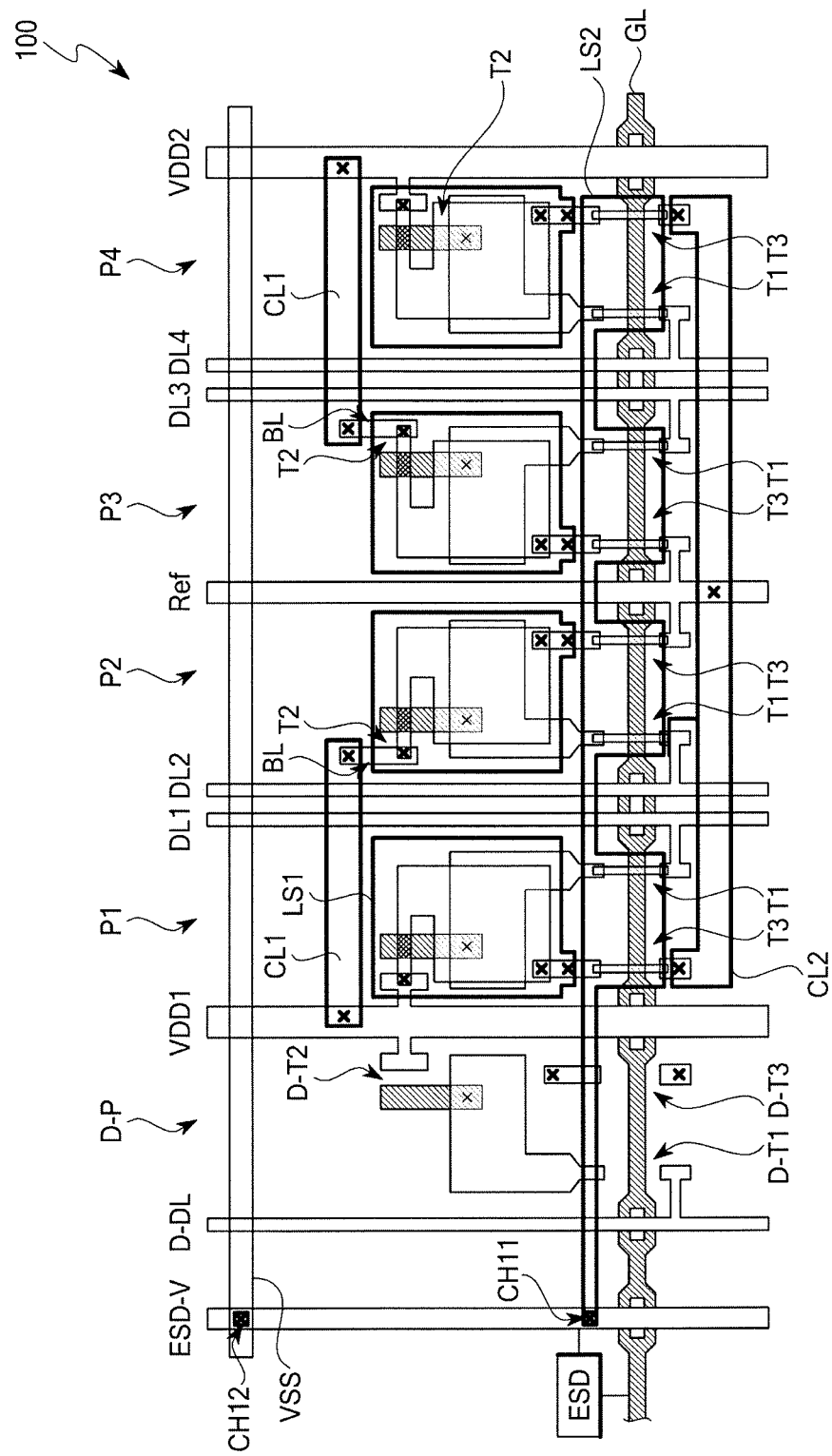
FIG. 10 is a plane view illustrating an organic light emitting display device according to another embodiment of the present invention.

FIG. 10 is a plane view illustrating an organic light emitting display device according to another embodiment of the present invention. Except that an electrostatic discharging line (ESD-V) is additionally connected with a low power line (VSS), the organic light emitting display device of FIG. 10 is the same as the organic light emitting display device of FIG. 8, whereby only different parts will be described in detail.

As shown in FIG. 10, in the same manner as the organic light emitting display device of FIG. 8, a second light shielding layer (LS2) is connected with the electrostatic discharging line (ESD-V) through an eleventh contact hole (CH11). Also, the electrostatic discharging line (ESD-V) is connected with the low power line (VSS) through a twelfth contact hole (CH12). The low power line (VSS) is connected with a cathode of an organic light emitting diode (OLED) provided in each of pixels (P1, P2, P3, P4).

Figure 11:
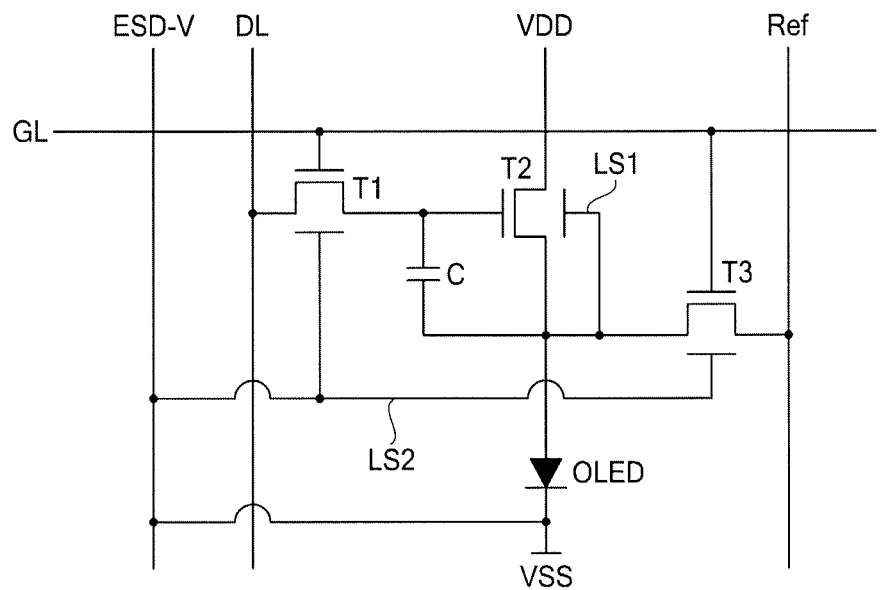
FIG. 11 is a circuit diagram illustrating an organic light emitting display device according to another embodiment of the present invention.

FIG. 11 is a circuit diagram illustrating the organic light emitting display device according to another embodiment of the present invention, which relates to the organic light emitting display device of FIG. 10. A detailed description for the same parts as those of FIG. 10 will be omitted.

As shown in FIG. 11, according to the organic light emitting display device according to another embodiment of the present invention, the second light shielding layer (LS2) covering an active layer of a switching thin film transistor (T1) and an active layer of a sensing thin film transistor (T3) is connected with the electrostatic discharging line (ESD-V). Also, the electrostatic discharging line (ESD-V) is connected with the low power line (VSS).

Figure 12:
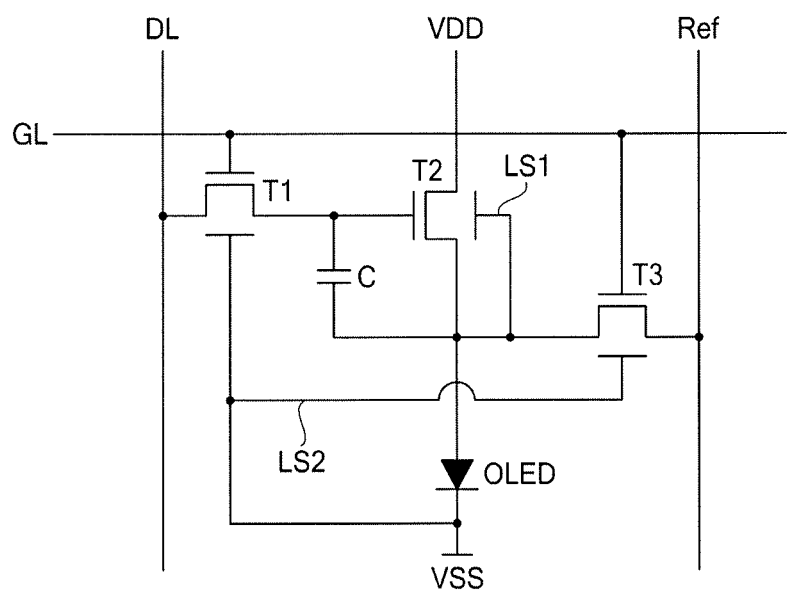
FIG. 12 is a circuit diagram illustrating an organic light emitting display device according to another embodiment of the present invention.

FIG. 12 is a circuit diagram illustrating an organic light emitting display device according to anther embodiment of the present invention, wherein a second light shielding layer (LS2) is directly connected with a low power line (VSS). In case of FIGS. 10 and 11, the second light shielding layer (LS2) is connected with the low power line (VSS) via the electrostatic discharging line (ESD-V). In case of FIG. 12, the second light shielding layer (LS2) is directly connected with the low power line (VSS). In other words, no additional line (such as the electrostatic discharging line (ESD-V) is connected between the second light shielding layer (LS2) and the low power line (VSS). However, the term "directly connected" may include a connection via a contact hole.

As mentioned above, the second light shielding layer (LS2) is connected with the conductive line so that it is possible to prevent bad influences on the operation of switching thin film transistor (T1) and sensing thin film transistor (T3). In detail, the second light shielding layer (LS2) may be connected with the reference line (Ref), may be connected with the dummy data line (D-DL), may be connected with the electrostatic discharging line (ESD-V), may be connected with the low power line (VSS) via the electrostatic discharging line (ESD-V), or may be directly connected with the low power line (VSS), but not limited to these structures. For example, after additionally forming a constant voltage line, the second light shielding layer (LS2) may be connected with the constant voltage line.

According to the embodiments of the present invention, the first and second light shielding layers (LS1, LS2) prevent external light from being incident on the active layer of the switching thin film transistor (T1) and the active layer of the driving thin film transistor (T2).

Especially, the first light shielding layer (LS1) covering the area of the driving thin film transistor (T2) is electrically insulated from the second light shielding layer (LS2) covering the area of the switching thin film transistor (T1) so that it is possible to prevent the malfunction of the switching thin film transistor (T1) when the driving thin film transistor (T2) is operated.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first substrate; and
   an organic light emitting diode disposed on the first substrate,
   wherein the first substrate includes:
   a first transistor including a first source electrode, a first drain electrode and a first semi-conductive layer, the first transistor provided inside a first pixel;
   a second transistor including a second source electrode, a second drain electrode and a second semi-conductive layer, the second transistor provided inside the first pixel;
   a third transistor including a third source electrode, a third drain electrode and a third semi-conductive layer, the third transistor provided inside the first pixel;
   a first light shielding layer electrically connected with the first transistor and overlapped with the first semi-conductive layer; and
   a second light shielding layer overlapped with the second semi-conductive layer, and
   wherein the first light shielding layer is electrically insulated from the second light shielding layer.

2. The organic light emitting display device according to claim 1, wherein the second light shielding layer is further overlapped with the third semi-conductive layer.

3. The organic light emitting display device according to claim 1, wherein the second light shielding layer is connected with a conductive line.

4. The organic light emitting display device according to claim 3, wherein the conductive line is coupled to an electrical potential that is lower than a threshold voltage of the second transistor.

5. The organic light emitting display device according to claim 3, further comprising a reference line connected with the third transistor,
    wherein the conductive line is formed of the reference line.
6. The organic light emitting display device according to claim 5, wherein the second light shielding layer is connected with the third transistor and the reference line through respective contact holes.
7. The organic light emitting display device according to claim 3, further comprising a dummy data line provided at an outer periphery of the first pixel,
    wherein the conductive line is formed of the dummy data line.
8. The organic light emitting display device according to claim 3, further comprising an electrostatic discharging line provided at an outer periphery of the first pixel,
    wherein the conductive line is formed of the electrostatic discharging line.
9. The organic light emitting display device according to claim 3, further comprising a cathode provided inside the first pixel, and a low power line connected with the cathode,
    wherein the conductive line is formed of the low power line.
10. The organic light emitting display device according to claim 1, further comprising a reference line electrically connected with the third transistor, and a connection line for connecting the third transistor with the reference line.
11. The organic light emitting display device according to claim 1, wherein the first light shielding layer is provided between the first substrate and the first semi-conductive layer.
12. The organic light emitting display device according to claim 1, wherein the second light shielding layer is provided between the first substrate and the second semi-conductive layer.
13. The organic light emitting display device according to claim 1, wherein the first substrate further includes:
    a fourth transistor including a fourth semi-conductor layer, the fourth transistor provided inside a second pixel;
    a fifth transistor including a fifth semi-conductor layer, the fifth transistor provided inside the second pixel;
    a sixth transistor including a sixth semi-conductor layer, the sixth transistor provided inside the second pixel; and
    a third light shielding layer overlapping the fourth semi-conductor layer.
14. The organic light emitting display device according to claim 13, wherein the third light shielding layer is electrically insulated from the first light shielding layer.
15. The organic light emitting display device according to claim 13, wherein the third light shielding layer is electrically insulated from the second light shielding layer.
16. The organic light emitting display device according to claim 13, wherein the first substrate further includes a fourth light shielding layer overlapping the fifth semi-conductor layer.
17. The organic light emitting display device according to claim 16, wherein the fourth light shielding layer is electrically connected with the second light shielding layer.
18. The organic light emitting display device according to claim 16, wherein the fourth light shielding layer is electrically insulated from the third light shielding layer.
19. The organic light emitting display device according to claim 16, wherein the fourth light shielding layer further overlaps the sixth semi-conductor layer.

* * * * *